United States Patent [19]

Holzl

[11] 4,153,483
[45] * May 8, 1979

[54] DEPOSITION METHOD AND PRODUCTS

[75] Inventor: Robert A. Holzl, La Canada, Calif.

[73] Assignee: Chemetal Corporation, Pacoima, Calif.

[*] Notice: The portion of the term of this patent subsequent to Aug. 9, 1994, has been disclaimed.

[21] Appl. No.: 788,356

[22] Filed: Apr. 18, 1977

Related U.S. Application Data

[60] Division of Ser. No. 588,390, Jun. 19, 1975, Pat. No. 4,040,870, which is a continuation-in-part of Ser. No. 358,110, May 7, 1973, abandoned.

[51] Int. Cl.² .................. B32B 15/00; B32B 15/18
[52] U.S. Cl. ........................... 148/31.5; 428/332; 428/457; 428/469; 428/660; 428/678; 428/938
[58] Field of Search ............... 148/31.5, 6.3, 6.35, 148/16.5; 428/408, 457, 409, 469, 539, 332, 660, 678, 938, 926; 427/248, 228, 249, 253, 255, 226

[56] References Cited

U.S. PATENT DOCUMENTS

| | | | |
|---|---|---|---|
| 3,151,001 | 9/1964 | Garofalo | 148/31.5 |
| 3,499,799 | 3/1970 | Patterson | 148/6.3 |
| 3,658,577 | 4/1972 | Wakefield | 427/242 |
| 3,684,585 | 8/1972 | Stroup et al. | 148/31.5 |
| 3,802,850 | 4/1974 | Clougherty | 428/660 |
| 3,824,134 | 6/1974 | Chance | 148/31.5 |
| 3,874,900 | 4/1975 | Post et al. | 148/31.5 |
| 3,988,955 | 11/1976 | Engel et al. | 148/31.5 |

FOREIGN PATENT DOCUMENTS 281996 12/1970 U.S.S.R. .................. 427/249

Primary Examiner—Arthur J. Steiner
Attorney, Agent, or Firm—Fitch, Even & Tabin

[57] ABSTRACT

A method of depositing a hard metal alloy is described wherein a volatile halide of titanium is reduced off the surface of a substrate and then reacted with a volatile halide of boron, carbon or silicon to effect the deposition on a substrate of an intermediate compound of titanium in a liquid phase. The liquid compound on the substrate is then reacted in the presence of hydrogen to produce a hard deposit containing titanium and boron, carbon or silicon. Also described are products which may be produced by the above method.

3 Claims, 3 Drawing Figures

DEPOSITION METHOD AND PRODUCTS

This application is a divisional application of application Ser. No. 588,390 filed June 19, 1975 now U.S. Pat. No, 4,040,870, which was a continuation-in-part of application Ser. No. 358,110 filed May 7, 1973 and now abandoned.

This application is a continuation in part of application Ser. No. 358,110 filed May 7, 1973, now abandoned. This invention relates to the production of hard deposits on substrates. More particularly, the invention relates to the production of deposits on substrates, as coatings, or the production of free standing objects made from a deposit after removal of a substrate. The deposits of the invention have physical characteristics which are substantially improved over those presently known to those skilled in the art.

The production of high hardness materials for wear or cutting purposes has been approached in a variety of ways. High carbon steel has often been employed, frequently utilizing alloying ingredients such a chromium, vanadium, tungsten, molybdenum, cobalt, and others to improve hardness, toughness and strength at various operating temperatures. Cast cobalt alloys, such as "Stellites", and similar materials have also been used for wear and cutting products. Another type of material has been composites of tungsten carbide or other carbides cemented with cobalt or nickel.

High carbon steel, with or without other alloying ingredients, has excellent bend strength, particularly at use temperature near room temperature, and quite high impact strength. High carbon steel, however, does not offer satisfactory hardness for wear resistant and cutting tool products, its hardness being about Vickers number 900 (Vickers hardness numbers are in kg/mm$^2$ and are designated in the Claims herein as VHN) or a Rockwell C hardness of about 65 to 70. Thus, high carbon and similar tool steels have certain limits on their use.

Cast cobalt alloys, particularly those having high percentages of carbon and metal alloying species such as chromium, tungsten and others, have hardness values similar to those of high carbon steel. Moreover, they maintain good hot hardness. However, these materials are more difficult to fabricate than high carbon steel, generally cost more, and are quite brittle.

In order to overcome the physical and mechanical shortcomings of the aforementioned products and the difficulty in manufacturing them, attempts have been made to produce these materials by deposition. High hardness materials are used as coatings on various types of substrates or are formed into free standing objects to product wear parts or tool products. for example, commercially successful products having coatings of titanium carbide over cemented tungsten carbide have been produced. Hardnesses of over 3000 Vickers with improved friction characteristics have been achieved. By way of further example, some small diameter tubing of tungsten carbide has been produced by deposition on a mandrel which is subsequently removed.

Deposits which have been produced commercially thus far, both for coating substrates and for producing free standing objects, have suffered certain drawbacks. Although hardness appears to be satisfactory in some cases, the strength and toughness of the material has often been lower than desired. Typically, such deposits have been produced by chemical vapor deposition techniques and have resulted in columnar grain structures wherein the grain size is relatively large. Because of the grain size and the columnar distribution of the grains, such deposits have tended to be relatively brittle and mechanically weak. Moreover, the production of hard metal coatings has generally required the use of a relatively high substrate temperature and relatively low deposition rate during the chemical vapor deposition process.

It is an object of the present invention to provide an improved method for producing coated substrates and free standing hard metal products.

Another object of the invention is to provide coated substrates and free standing hard metal products having improved physical characteristics.

Another object of the invention is to provide, on substrates, improved deposits of superior quality.

It is another object of the invention to provide coated substrates with the coating having extremely high hardness.

Other objects of the invention will become apparent to those skilled in the art from the following description, taken in connection with the accompanying illustrations wherein.

Very generally, the method of the invention comprises providing a volatile halide in a gaseous form of titanium. the volatile halide is then reduced off the surface of the substrate to form a lower halide of titanium. This lower halide is reacted in the presence of a volatile halide or boron, carbon or silicon to cause deposition on the substrate of an intermediate compound of titanium which is in a liquid phase. The liquid phase intermediate compound is then reacted on the substrate with a volatile halide of boron, carbon or silicon to produce a hard deposit containing titanium and boron, carbon or silicon.

Figure 1:
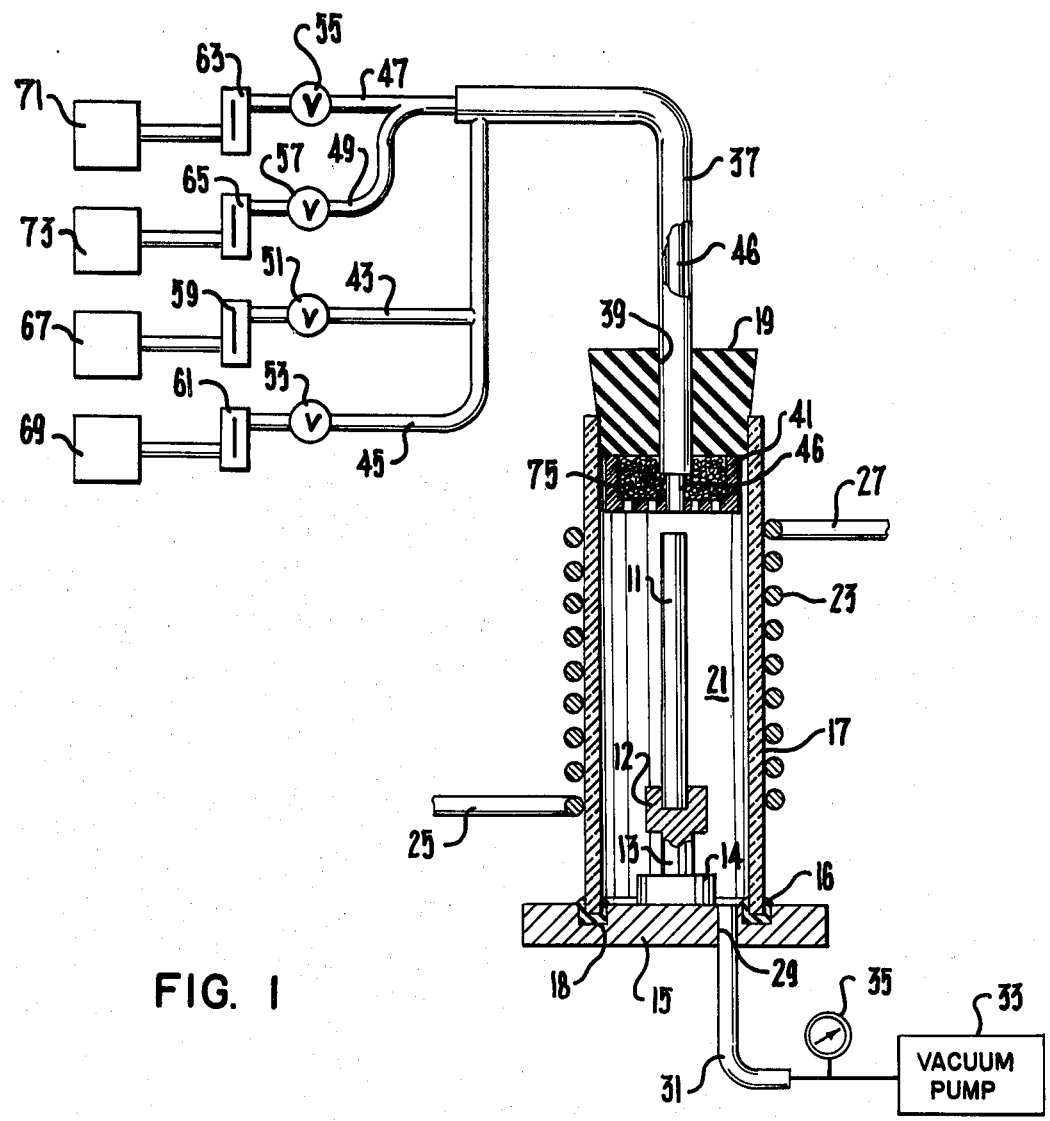
FIG. 1 is a schematic diagram of a chemical vapor deposition system which may be employed in the practice of the method of the invention.

Chemical vapor deposition, or CVD, is a well known technique for producing a coated substrate. In FIG. 1, one common type of CVD apparatus is illustrated which is used for coating a substrate 11, the latter being shown as a generally cylindrical rod. The rod 11 is supported in a work holder or fixture 12 supported from a rod 13 resting on a disc-shaped base 14. The disc-shaped base 14 is supported on a reactor base 15 which is provided with an annular groove 16 therein.

The reactor is completed by a heat proof cylindrical walled tube 17 of quartz or similar material which seats in the annular groove 16 and is sealed therein by an annular seal 18. The top of the quartz tube 17 is closed by a rubber stopper 19 of conventional design removably secured therein. There is, therefore, defined a reaction chamber 21 in which the deposition process takes place.

In order to heat the substrate 11 to the desired temperature, as will be explained, an induction heating coil 23 is provided surrounding the outer wall of the glass or quartz tube 17. The induction heating coil 23 is supported by means not shown and is provided with leads 25 and 27 to which the induction heating current is conducted from a suitable source, also not shown.

In order to regulate the pressure within the reaction chamber 21 and evacuate gasses therefrom, the lower wall or base 15 of the reactor is provided with an opening 29 therein through which a tube 31 is passed. The tube 31 is suitably connected to a vacuum pump 33 and a vacuum gauge 35 is connected in the line thereto for indicating the pressure within the chamber 21. By properly operating the vacuum pump 33, the pressure within the chamber 21 may be regulated as desired.

A gas inlet tube 37 is provided in the rubber stopper 19 through a central opening 39 therein. There is optionally provided at the terminus of the tube 37 within the chamber 21, a porous basket 41 for purposes subsequently described. The tube 37 is connected through a plurality of tubes 43 and 45 to regulator valves 51 and 53 and flowmeters 59 and 61, respectively. Sources 67 and 69 of reactant gasses are connected to the flowmeters 59 and 61, respectively, for introducing some of the desired reactant gasses for producing the chemical vapor deposition reactions within the chamber 21, as will be subsequently described.

A gas inlet tube 46 passes coaxially in the tube 37 and the porous basket 41 to the region upstream of the substrate 11 in the reactor. The tube 46 is connected by tubes 47 and 49 to regulator valves 55 and 57, and flowmeters 63 and 65, respectively. Sources 71 and 73 of reactant gasses are connected to the flowmeters 59 and 61 for introducing reactant gasses through the tube 46 to the chamber 21.

A known method in which a coating of high hardness is produced on a substrate by chemical vapor deposition involves the introduction to the reaction chamber 21 of a volatile compound of the metal species desired in the deposit. Typically, this is a metal halide. This material, in gaseous form, is passed over a heated substrate, on which heated surface it is decomposed to deposit the metal of interest. A gaseous reducing agent, such as hydrogen, may be mixed with the volatile compound of the metal to assist in reducing it on the heated surface of the substrate. Other gaseous compounds may be added to the gas stream, such as carbon bearing gasses, whereby compounds of the metal, such as carbides, are formed by chemical reaction on the heated surface. A more complete explanation of the chemical vapor deposition process may be found in Chapter 13 of the book "Vapor Deposition" edited by Powell, Oxley and Blocker, published by Wylie & Sons, 1966.

Figure 2:
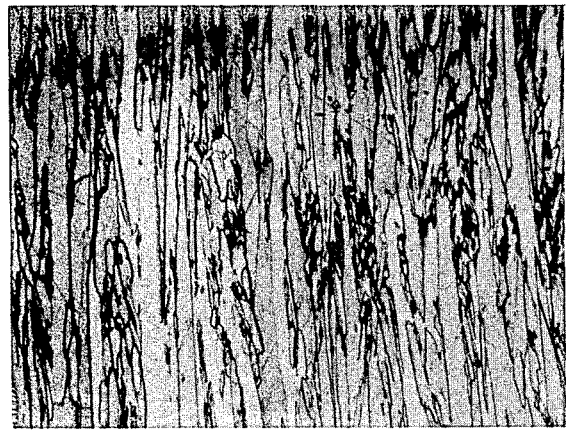
FIG. 2 is a photomicrograph at about 200 times magnification of a cross section of a deposit produced in accordance with prior art chemical vapor deposition techniques.

In FIG. 2, a cross sectional photomicrograph, magnified 200 times, shows a coated substrate produced by typical prior art CVD techniques, more specifically set out in Example 3 below. The specimen was etched in a mixture of dilute nitric and dilute hydrofluoric acid for about 30 seconds at room temperature. It may be seen that the deposit is comprised of relatively large columnar grains which are oriented perpendicularly of the substrate surface. Such deposits are typically quite brittle.

In each case involving the practice of chemical vapor deposition, effort is made to insure that the chemical reactions which cause the deposition take place on the surface of the substrate. In other words, a reaction is caused which directly produces a solid deposit from the gaseous reactant or reactants on the surface of the substrate or mandrel. Heretofore, if the reaction was allowed to proceed in the gas stream away from the heated surface, powdery non-adherent and non-coherent deposits were made.

The method of the present invention, although similar to chemical vapor deposition, is not truly that. The method of the invention employs a deposition apparatus essentially similar to a chemical vapor deposition apparatus, however, the apparatus is operated in such a manner that the typical chemical vapor deposition process does not take place.

In accordance with the method of the invention, a sequence of events is made to take place which is different from what has been believed desirable by those skilled in the art. It has been discovered that superior deposits can be produced by causing a chemical reaction off of the surface of the substrate resulting in an intermediate product which is deposited on the substrate or mandrel in a liquid phase, and by further reacting the liquid phase on the substrate to form the desired solid phase.

A volatile halide of titanium is reduced off of the surface of the substrate to a lower halide. The substance for causing the reduction which may be introduced from the source 69 or may be provided in particulate form as indicated at 75 is suspended within the porous basket 41. In either case, there is occurring within the chamber 21 and spaced from the surface of the substrate 11, a reaction which produces a lower halide of titanium. The chamber wall is kept at a sufficiently higher temperature to prevent condensation of the lower halide on the wall.

This lower halide is then reacted in the presence of a volatile halide of boron, carbon or silicon to cause the deposition on the substrate of the intermediate liquid phase. To cause this reaction, the volatile halide of boron, carbon or silicon is introduced to the reactor at a region which is downstream from the initial reduction reaction, such as through the tube 46 from the source 71. The further reaction produces a fog or halo around the substrate which is observable during the process and which results in the deposition of a liquid on the substrate surface. This liquid is also observable.

The liquid phase which is deposited on the substrate is then reacted with a volatile halide of boron, carbon or silicon to form the desired solid deposit. Although this mechanism is not entirely understood, it is believed that this reaction of the liquid phase, although slower than the reaction to form the deposited liquid, occurs relatively rapidly by comparison with an all gaseous reaction, thereby contributing to higher efficiency and greater deposition rate. It has been determined that if the method of the invention is practiced, deposition can be effected at substantially higher rates at lower temperatures than with conventional chemical vapor deposition.

Although not essential, the reactions above described are preferably carried out in the presence of hydrogen gas. A low of hydrogen in the reactor has typically resulted in much better process operation and more rapid deposition rates. Where hydrogen is used as the reducing agent in the initial reduction of the titanium halide, the hydrogen is, of course, already present in the reactor. Where titanium chips are used in the bed 75, the hydrogen may be introduced through the tube 46 from the source 73.

It is preferable from the point of view of maximum hardness and strength that the liquid deposit be formed from a lower halide of the titanium. However, other reactions to form a liquid may be possible. In any case, however, the method of the invention depends uniquely on the formation of such a liquid deposit as a precursor to the solid hard metal deposit.

In practicing the method of the invention, the preliminary reduction preferably occurs at a temperature not less than 700° C. The preliminary reduction may be effected by passing the titanium halide through a particulate matter such as titanium metal chips as previously described, or by simply passing the halide with a reductant gas through a heated zone, such as a heated bed of porous ceramic material or chips.

The method of the invention is capable of producing coatings which exhibit extremely hard properties, e.g. in excess of 4000 Vickers hardness number. These deposits are useful as coatings, and may be made so thin as to produce a negligible change in the substrate dimension. From a commercial point of view, the coatings of principal interest are titanium with boron.

These coatings may be applied to many different substrates such as graphite; refractory ceramics, such as oxides; cemented tungsten carbides; refractory metal, such as tungsten, molybdenum, titanium, and even iron, nickel or cobalt base materials. In the case of low expansion coefficient materials the coating is regularly applied directly as an overlayer, in other words, a buildup on the surface with no pretreatment of the surface required. In the case of the iron, nickel and cobalt base materials, wherein the expansion coefficient of the coating is vastly different from that of the substrate, it is frequently necessary to petreat the substrate with a diffusion coating first.

A pretreatment where the difference in expansion coefficient is great, which has been investigated and proved to be particularly desirable, is the diffusion of boron into the surface of the substrate. This diffusion coating has the effect of increasing the compression strength of the substrate as well as changing the expansion coefficient near the surface somewhat. Although it has not been demonstrated experimentally, it is likely that other diffusion coatings into an iron, nickel or cobalt substrate would be useful before applying the hard coating. Other diffusion coatings which would perform a similar function would be silicon, carbon or nitrogen. The diffusion coating may be made by one of two well known chemical vapor deposition methods, pack-cementation or a flowing gas system. The latter is preferred for reasons which will become apparent during the description set forth below.

Boronization of an iron, nickel or cobalt substrate may be conducted at any temperature above 600° C. using a gaseous mixture of boron chloride and hydrogen. The lower temperature limit is a practical one, dependent upon the acceptable rates of deposition and diffusion from a production standpoint. The upper temperature limit is that of the boron-metal eutectic formation. In the case of iron base alloy, the maximum temperatures are in the order of 1150° C., for nickel base 950° C., and for cobalt base about 1100° C. The precise temperatures depend upon the eutectic formation, which is influenced somewhat by the minor species involved in the alloys. However, maximum variation as a result of the presence of such minor species seldom exceeds 50° C. Preferably, the boronization is to a depth of at least 10 microns, and shows up as a clear white and a clear gray layer when etched in 2% nitric acid in alcohol.

As a practical matter, the preferred boronization temperature is about 50° C. below the eutectic temperature to provide optimum production rates. Optimum surface and dimensional fidelity of substrate material is obtained when boronizing is conducted no higher than 950° C. for iron base, 850° C. for nickel base, or 900° C. for cobalt base alloys. By hardening the substrate utilizing boronization, the hardening can be conducted at lower temperatures than any other method producing equivalent hardness, and amorphous or sooty deposits are avoided more readily, thereby allowing the subsequent coating operation described below. The boronized portion of the substrate appears as having a clear white layer and a clear gray layer when etched with 2% nitric acid in alcohol.

The boronized substrate surface, or other of the acceptable substrates cited earlier, may then be coated with a thin deposit of titanium and boron, carbon or silicon. Best results have been achieved with titanium and boron hard metal compositions. This codeposit may be maintained extremely thin and provides an extreme degree of hardness for superior wear and abrasion resistance in tool applications.

The method of the invention for the deposition of titanium and boron is as generally described above. A halide of titanium, such as titanium tetrachloride, is flowed into the reactor and is reduced to a lower chloride of titanium as an intermediate reaction. This lower chloride of titanium flows over the heated substrate, is further reacted and deposits with gaseous boron trichloride as liquid. Further reaction of the liquid occurs to form a solid deposit of titanium and boron. The existence of the liquid deposit has been demonstrated both by direct observation of the liquid formation on the surface and by inferential data. Methods of effecting the partial reduction of the titanium tetrachloride are the flowing of the titanium tetrachloride through a heated bed of titanium chips, or flowing a mixture of hydrogen and titanium tetrachloride over a heated surface of indifferent material such as alumina beads. The resultant solid deposit, when the necessary intermediate reaction is caused to happen, is either a smooth vitreous appearing coating or a botryoidal coating.

If the intermediate reaction is not caused to happen as, for example, directly injecting the titanium tetrachloride into the gas stream without the necessary preheat and high temperature reduction, a typical coarse hexagonal crystal of titanium boride is deposited. Xray investigation demonstrates that either type of deposit is probably titanium diboride. There is, however, a very substantial difference in the properties of the two deposits as made by the two methods. The deposits made by the method of the invention, i.e. the vitreous or botryoidal coatings, are extremely hard by comparison with those made by the conventional chemical vapor deposition techniques. The harder deposits regularly measure greater than 4000 Vickers and have, in fact, been measured at hardnesses of over 6000 Vickers. The variation is due to the difficulty in the precise measurements of the thin coatings of such hard materials. By comparison, a typical crystalline, or conventional titanium diboride coating has a hardness Vickers number of between 2800 and 3200. This latter hardness is the hardness generally accepted in the trade for titanium diboride.

The following examples serve to assist in an understanding of the invention:

EXAMPLE 1

Figure 3:
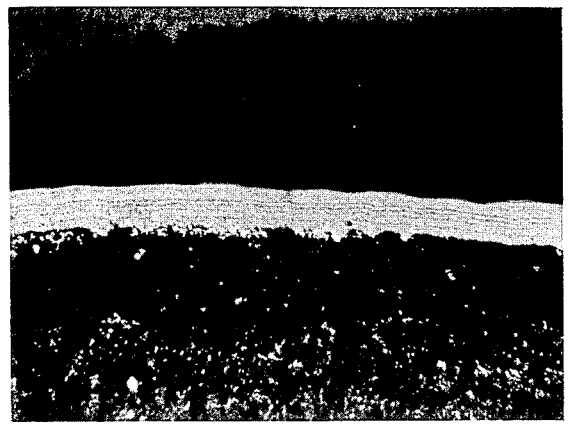
FIG. 3 is a photomicrograph at about 200 times magnification illustrating a cross section of a deposit produced in accordance with the invention.

High-speed steel 3.1 mm diameter drills were first boronized by passing an 8:1 volume ratio mixture of hydrogen and boron trichloride over them at a temperature of 950° C. at a pressure of 200 Torr for 15 minutes. The drills were then racked in a furnace, heated to a temperature of 750° C. and maintained at a pressure of 200 Torr. Titanium tetrachloride at a flow rate of 100 ml/min was passed through a bed of titanium chips at the same pressure, heated to 850° C. Boron trichloride at a flow of 400 ml/min and hydrogen at a flow of 800 ml/min were mixed with the effluent from the chip bed and passed into the reactor furnace without cooling. In 40 minutes, a smooth, bright coating of 0.025 mm thickness adherent to the steel was produced. After coating, the parts were heated to 1150° C. and rapidly quenched in hydrogen gas to assure the hardness of the steel at Rockwell—C 65. The coating had a hardness of 7000 kg/mm$^2$ when measured with a 500 gram weight on a Vickers hardness tester. The drills successfully produced 9000 holes in laminated glass fiber printed circuit board material as compared with 30 holes before failure for similar drills uncoated. Metallographic sections of the deposit showed a lamellar deposit as shown in FIG. 3.

EXAMPLE 2

A cemented carbide rod of 1.5 mm diameter was coated in a manner similar to Example 1. No preliminary boronization was conducted. The titanium tetrachloride at 100 ml/min and the hydrogen at 800 ml/min were passed through a bed of alumina beads heated to 700° C. before mixing with the boron trichloride at 400 ml/min. The gas mixture was directly injected into the furnace in which the drill rod was mounted with the furnace held at 850° C. A coating of 0.020 mm was made in 20 minutes. The coating was bright, smooth and adherent and had a Vickers hardness number of 5800 kg/mm$^2$ measured with a 500 gram weight. The metallographic section was similar to that of FIG. 3, showing the same lamellar structure rather than the well defined crystal structure of chemically vapor deposited materials.

EXAMPLE 3

The experiment of Example 2 was run again except that the titanium tetrachloride, hydrogen, and boron trichloride were directly injected into the furnace without any provision for preliminary reduction of the titanium tetrachloride. The surface of the carbide drill rod was slightly discolored but there was no measurable hardness increase. Metallographic examination showed only a slight coarsening of the grain boundaries near the surface and no well defined coating.

EXAMPLE 4

An experiment was run using direct injection of titanium tetrachloride at 100 ml/min, boron trichloride at 400 ml/min, and hydrogen at 1600 ml/min into the reactor furnace. The specimens were 1.5 mm cemented carbide rods. The furnace was held at 1100° C. and the gases pumped off to maintain 200 Torr. After 60 minutes a bright coating of 0.008 mm was achieved. The coating had well developed columnar hexagonal crystals with a hardness of 2900 VHN.

The above Examples 3 and 4 illustrate the necessity for the reaction of the titanium tetrachloride to form a lower chloride which is deposited as a liquid in accordance with the method of the invention. In Example 3, since there was no lower chloride formation and no possibility of the liquid deposition, no deposit was effected at the low deposition temperature. In Example 4, the temperature of deposition was too high to allow liquid deposition so that the mechanism for the deposit was one of ordinary CVD and the columnar crystals were in evidence.

EXAMPLE 5

The process of Example 1 was repeated using 3.1 mm diameter high speed steel drills. All conditions were the same except that carbon tetrachloride at a flow of 400 ml/min was used instead of boron trichloride. The coating has a hardness of 4500 kg/mm$^2$ when measured with a 500 gram weight on a Vickers hardness tester. Drills did not fail in 1000 hole tests on laminated glass fiber printer circuit board material.

EXAMPLE 6

The process of Example 2 was repeated using silicon tetrachloride instead of boron trichloride. The coating was bright, smooth, and adherent with a Vickers hardness number of 1650 kg/mm$^2$ when measured with a 500 gram weight. The metallographic section showed the lamellar structure, similar to that of FIG. 3.

In performing the above Examples 1, 2, 5 and 6, the following reactions are believed to be representative of the deposition mechanism:

$$3TiCl_4(g) + Ti(s) \rightarrow 4TiCl_3(g)$$

$$2TiCl_4(g) + H_2(g) \rightarrow 2TiCl_3(g) + HCl$$

in the gas stream, plus
$$TiCl_3(g) + \tfrac{1}{2}H_2 \rightarrow TiCl_2(l) + HCl$$

resulting in deposit of a liquid on the surface followed by
$$TiCl_2(l) + 2BCl_3(g) + 4H_2(g) \rightarrow TiB_2 + 8HCl.$$

EXAMPLE 7

An experiment was run using direct injection of titanium tetrachloride at 100 ml/min; 50 ml/min silicon tetrachloride; 4200 ml/min hydrogen; and 7000 ml/min or argon to approximate conventional chemical vapor deposition techniques. The resultant deposit at 950 to 1000° C. was fine crystalline in superficial appearance and had a Vickers hardness number of 950 kg/mm$^2$ when measured with a 500 gram weight. The cross section showed typical columnar grains similar to FIG. 2.

Examples 6 and 7 show the difference between the method of the invention, wherein a layered deposit essentially free of columnar grains is formed from the intermediate liquid layer, and the conventional chemical vapor deposition method.

Of particular significance with regard to this method is the temperature at which the deposits can be produced at an acceptable commericial rate. It is well known that titanium carbide deposits as made by chemical vapor deposition are regularly conducted in the range of 900° C. to 1200° C. To produce a useful coating, in the order of 10 microns in thickness, several hours of processing are required. The method of the invention provides a superior processing technique from this point of view. The coatings which have superior properties, as noted, may be deposited at temperatures as low as 750° C. at a high deposition rate. Processing times for depositing with the intermediate liquid phase are as little as 15 minutes for a 10 micron coating.

It may therefore be seen that the invention provides an improved method for producing a coated substrate, as well as improved quality coated substrates. By providing an intermediate liquid phase on the surface of the substrate being coated, and subsequently reacting the liquid to produce the final solid coating composition, the structure of the coating composition is such as to provide superior physical qualities. More particularly, titanium-boron deposits of extremely high hardness values result, as well as excellent resistance to corrosion. Other titanium metal systems involving carbon or silicon can also be effectively improved in their deposit quality in accordance with the invention.

Various modifications of the invention in addition to those shown and described herein will become apparent to those skilled in the art from the foregoing description and accompanying drawings. Such modifications are intended to fall witin the scope of the appended claims.

What is claimed is:

1. A coated substrate product comprising a substrate of a material selected from the group consisting of graphite, refractory ceramics, cemented carbides, refractory metals, and iron, nickel and cobalt base materials, upon which has been thermochemically deposited a coherent coating comprised essentialy of titanium and boron in the form titanium diboride free of columnar crystals to a thickness of not less than 1 micron or more than 20 microns and having a superficial hardness of greater than 3500 VHN, wherein the coating is deposited by providing a gaseous volatile halide of titanium, reducing said volatile halide off the surface of the substrate to form a lower halide of titanium, reacting said lower halide in the presence of a volatile halide of boron downstream from said reduction while maintaining the pressure and substrate temperature such as to cause the deposition on the substrate of an intermediate compound of titanium which is in a liquid phase, and reacting said liquid phase intermediate compound on the surface of the substrate with a volatile halide of boron to produce a hard deposit containing titanium and boron.

2. A product according to claim 1 wherein said substrate is selected from the group consisting of iron, nickel and cobalt base alloys and wherein into the surface of said substrate a substance selected from the group consisting of boron, carbon and silicon, is diffused to a depth of at least 10 microns.

3. A coated substrate product comprising a substrate of a material selected from the group consisting of graphite, refractory ceramics, cemented carbides, refractory metals, and iron, nickel and cobalt base materials having a surface in which boron is diffused to a depth of at least 10 microns in sufficient quantity as to produce a clear white layer and a clear gray layer when etched in 2% nitric acid in alcohol, and a thermochemically deposited coherent coating of primarily titanium and boron in the form titanium diboride between 1 and 20 microns thick free of columnar crystals and having a hardness exceeding 3500 VHN, wherein the coating is deposited by providing a gaseous volatile halide of titanium, reducing said volatile halide off the surface of the substrate to form a lower halide of titanium, reacting said lower halide in the presence of a volatile halide of boron downstream from said halide reduction while maintaining the pressure and substrate temperature such as to cause the deposition on the substrate of an intermediate compound of titanium which is in a liquid phase, and reacting said liquid phase intermediate compound on the surface of the substrate with a volatile halide of boron to produce a hard deposit containing titanium and boron.

* * * * *